(12) United States Patent
Clampitt et al.

(10) Patent No.: US 6,716,719 B2
(45) Date of Patent: Apr. 6, 2004

(54) METHOD OF FORMING BIASABLE ISOLATION REGIONS USING EPITAXIALLY GROWN SILICON BETWEEN THE ISOLATION REGIONS

(75) Inventors: Darwin A. Clampitt, Homedale, ID (US); Shawn D. Lyonsmith, Boise, ID (US); Regan S. Tsui, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/157,049

(22) Filed: May 29, 2002

(65) Prior Publication Data

US 2003/0224569 A1 Dec. 4, 2003

(51) Int. Cl.⁷ ................................................. H01L 21/76
(52) U.S. Cl. ........................ 438/424; 438/425; 438/442
(58) Field of Search ................................ 438/424, 427, 438/431, 437, 433, 442, 362; 257/50, 510, 513, 506

(56) References Cited

U.S. PATENT DOCUMENTS

| | | | |
|---|---|---|---|
| 5,410,176 A | * | 4/1995 | Liou et al. ................. 257/49 |
| 5,492,853 A | | 2/1996 | Jeng et al. |
| 5,640,034 A | | 6/1997 | Malhi |
| 5,763,932 A | | 6/1998 | Pan et al. |
| 5,777,365 A | | 7/1998 | Yamaguchi et al. |
| 5,888,881 A | | 3/1999 | Jeng et al. |
| 5,895,253 A | | 4/1999 | Akram |
| 5,903,026 A | | 5/1999 | Gonzalez |
| 5,945,724 A | | 8/1999 | Parekh et al. |
| 5,953,621 A | | 9/1999 | Gonzalez et al. |
| 5,977,579 A | | 11/1999 | Noble |
| 6,051,480 A | | 4/2000 | Moore et al. |
| 6,107,157 A | | 8/2000 | Fazan et al. |
| 6,110,798 A | | 8/2000 | Gonzalez et al. |
| 6,165,853 A | | 12/2000 | Nuttall et al. |
| 6,177,333 B1 | | 1/2001 | Rhodes |
| 6,238,999 B1 | | 5/2001 | Dickerson et al. |
| 6,261,922 B1 | | 7/2001 | Walker et al. |
| 6,265,282 B1 | | 7/2001 | Lane et al. |
| 6,271,153 B1 | | 8/2001 | Moore |
| 6,271,561 B2 | | 8/2001 | Doan |
| 6,274,498 B1 | | 8/2001 | Moore et al. |
| 6,300,219 B1 | | 10/2001 | Doan et al. |
| 6,322,634 B1 | | 11/2001 | Pan |
| 6,323,104 B1 | | 11/2001 | Trivedi |
| 6,340,624 B1 | | 1/2002 | Doan et al. |
| 2002/0019113 A1 | * | 2/2002 | Chung ........................ 438/424 |

* cited by examiner

Primary Examiner—Dung A. Le
(74) Attorney, Agent, or Firm—Wong, Cabello, Lutsch, Rutheford & Brucculeri, L.L.P.

(57) ABSTRACT

An improved isolation structure for use in an integrated circuit and a method for making the same is disclosed. In a preferred embodiment, an silicon dioxide, polysilicon, silicon dioxide stack is formed on a crystalline silicon substrate. The active areas are etched to expose the substrate, and sidewall oxides are formed on the resulting stacks to define the isolation structures, which in a preferred embodiment constitute dielectric boxes containing the polysilicon in their centers. Epitaxial silicon is grown on the exposed areas of substrate so that it is substantially as thick as the isolation structure, and these grown areas define the active areas of the substrate upon which electrical structures such as transistors can be formed. While the dielectric box provides isolation, further isolation can be provided by placing a contact to the polysilicon within the box and by providing a bias voltage to the polysilicon.

35 Claims, 10 Drawing Sheets

US 6,716,719 B2

METHOD OF FORMING BIASABLE ISOLATION REGIONS USING EPITAXIALLY GROWN SILICON BETWEEN THE ISOLATION REGIONS

FIELD OF THE INVENTION

This invention relates generally to methods for forming biasable isolation regions in a crystalline substrate using epitaxially grown silicon between the regions.

BACKGROUND OF THE INVENTION

As is well known in the art of integrated circuit manufacturing, active electrical structures such as transistors can be built upon crystalline substrates, typically of silicon, to form useful circuits. A typical integrated circuit contains many such electrical structures that are platted or "laid out" upon an area in the top of the substrate. However, because such crystalline substrates are often semiconductive, and hence can carry some degree of current, care must be taken to make sure that a given electrical structure does not electrically interfere with other adjacent electrical structures. To prevent the leakage of current between such electrical structures, the art has traditionally placed isolation structures between the active areas of the substrate which carry the electrical structures.

Many prior art isolation techniques are known. One such technique, illustrated in FIG. 1, is the formation of LOCOS ("LOCal Oxidation of Silicon") islands 12, which are used to isolate two active regions 14 in a substrate 10. As is well known, LOCOS islands 12 are formed by masking the active regions 14 and oxidizing the silicon substrate to form the silicon dioxide (oxide) LOCOS islands 12. Thereafter, electrical structures, such as transistors 16 (which include a gate 18, source 20, and drain 22) can be fabricated in the active regions 14. The LOCOS islands 12, if properly fabricated, will be wide enough (w) to prevent lateral leakage through the substrate (e.g., from source 20a to drain 22b), and further will be thick enough (t) to prevent voltages from any overlying conductors (not shown) from electrically biasing the underlying substrate in a manner that would further promote such lateral leakage.

Another more recent technique, illustrated in FIG. 2, is the formation of trench isolation structures. Generally, trench isolation structures are formed by masking the active regions 34 and etching a trench 32 into the silicon substrate 30. This trench 32 can then be filled, usually by depositing an oxide or other dielectric onto the etched surface, and etching or polishing the oxide so that it is substantially flush with the surface of the substrate 30 to form a dielectric plug 35. Thereafter, and as with the LOCOS process, electrical structures, such as transistors 36, can be formed in the active regions. The trench isolation structures so formed thus prevent lateral leakage between the electrical structures, as in the LOCOS process.

Many modifications of these prior art techniques exist. For example, to provide further lateral leakage protection, it is known and sometimes desirable to dope the substrate beneath the isolation structure to make it more difficult for lateral leakage currents to flow. For example, if the substrate below the isolation structure is p-type (i.e., rich not in negatively charged electrons but rich in positively charged holes, e.g., by doping with Boron), it may be beneficial to ion implant or diffuse extra p-type dopants (e.g., Boron) into the substrate before formation of the dielectrics that form the isolation structures. The presence of these extra dopants can make it more difficult for lateral currents to flow, and also make it more difficult for any overlying voltages to electrically influence the substrate to inadvertently promote such leakage. The approximate location of such extra dopants, if present, is shown in FIGS. 1 and 2 as element 40. Examples of these prior art techniques, and their various modifications, can be found in the following U.S. Patents, which are hereby incorporated by reference: U.S. Pat. Nos. 6,265,282; 6,261,922; 5,895,253; 5,945,724; 6,110,798; 5,953,621; 5,903,026; 5,777,365; 6,238,999; 5,888,881; 5,492,853; 6,274,498; 6,271,153; 6,051,480; 6,322,634; 5,763,932; 6,323,104; 6,165,853; 5,640,034; 6,177,333; 5,977,579; 6,107,157; 6,271,561; 6,340,624; 6,300,219.

Prior art isolation techniques, while suitable for many applications, can have certain drawbacks. Some techniques involve many separate processing steps, which are expensive and/or difficult to manufacture. Other techniques may not provide suitable isolation, either because the isolation structures are too thin (allowing excessive lateral leakage due to parasitic capacitance), or are too susceptible to overlying voltages that, as noted, can assist in promoting lateral leakage. Such problems are further exacerbated when one considers that the integrated circuit industry constantly strives to make smaller (and hence more cost-effective) circuits which are more closely packed together. Without reduction in the voltages used to run the circuits, the shrinking of the geometries of the structures on the integrated circuit chips will increase leakage currents as the thickness or width of the isolation dielectrics also shrinks. Accordingly, an improved isolation structure is desired—one that is simple to manufacture, uses well-known and well-established processing techniques, and which will adequately minimize leakage throughout the substrate even for very small and dense geometries.

SUMMARY OF THE INVENTION

An improved isolation structure for use in an integrated circuit and a method for making the same are disclosed. In a preferred embodiment, a silicon dioxide, polysilicon, silicon dioxide stack is formed on a crystalline silicon substrate. The active areas are etched to expose the substrate, and sidewall oxides are formed on the resulting stacks to define the isolation structures, which in a preferred embodiment constitute dielectric boxes containing the polysilicon in their centers. Epitaxial silicon is grown on the exposed areas of substrate so that it is substantially as thick as the isolation structure, and these grown areas define the active areas of the substrate upon which electrical structures such as transistors can be formed. While the dielectric box provides isolation, further isolation can be provided by placing a contact to the polysilicon within the box and by providing a bias voltage to the polysilicon.

BRIEF DESCRIPTION OF THE DRAWINGS

The foregoing and other features and aspects of the present invention will be best understood with reference to the following detailed description of specific embodiments of the invention, when read in conjunction with the accompanying drawings, wherein.

DETAILED DESCRIPTION OF EMBODIMENTS OF THE INVENTION

In the disclosure that follows, in the interest of clarity, not all features of actual implementations are described in this disclosure. It will of course be appreciated that in the development of any such actual implementation of the disclosed invention, as in any such project, numerous engineering and design decisions must be made to achieve the developers' specific goals, e.g., compliance with mechanical and business related constraints, which will vary from one implementation to another. While attention must necessarily be paid to proper engineering and design practices for the environment in question, it should be appreciated that such a development effort would nevertheless be a routine undertaking for those of skill in the art given the details provided by this disclosure, even if such development efforts are complex and time-consuming.

Figure 1:
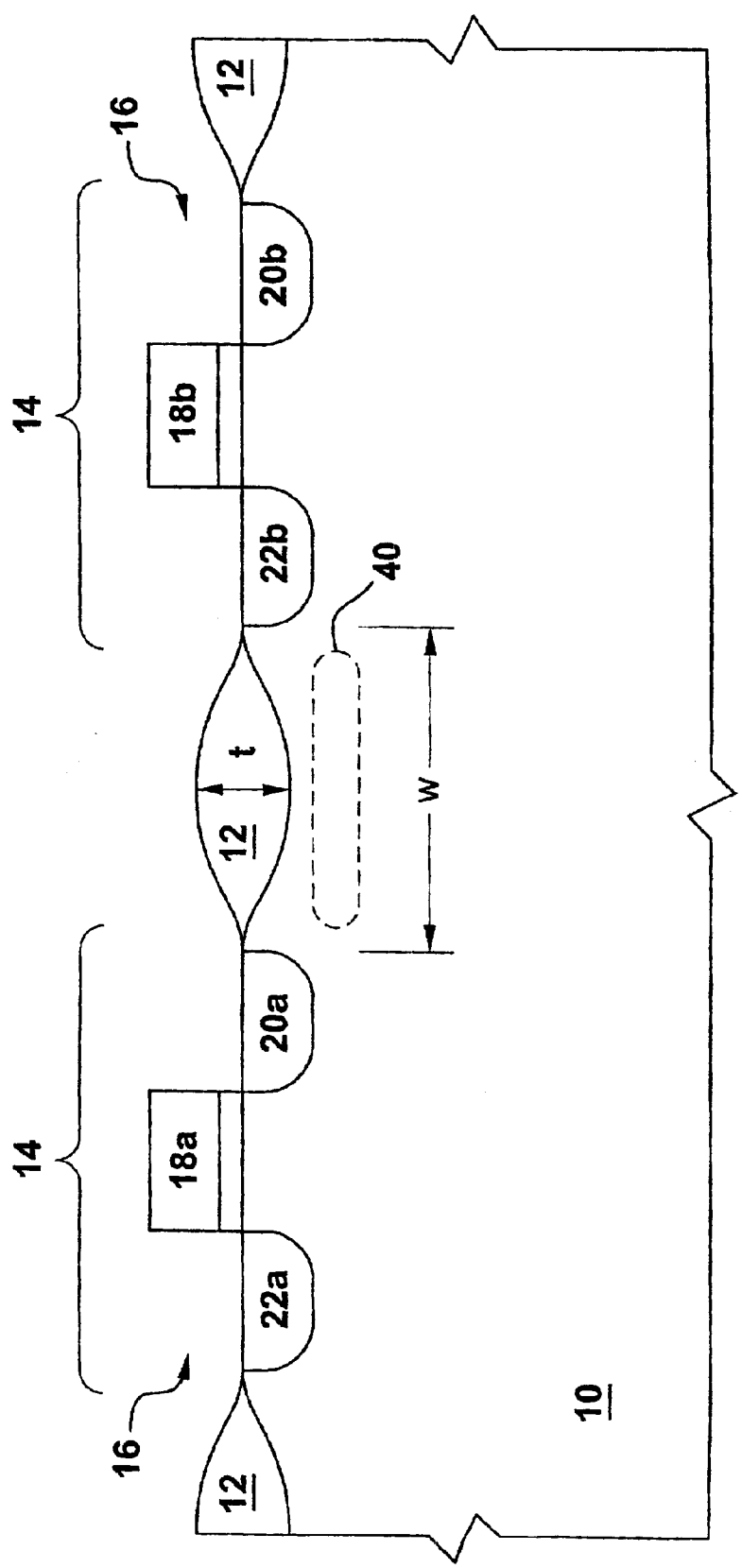
FIG. 1 shows a cross-sectional view of the prior art LOCOS method of isolation.
Figure 2:
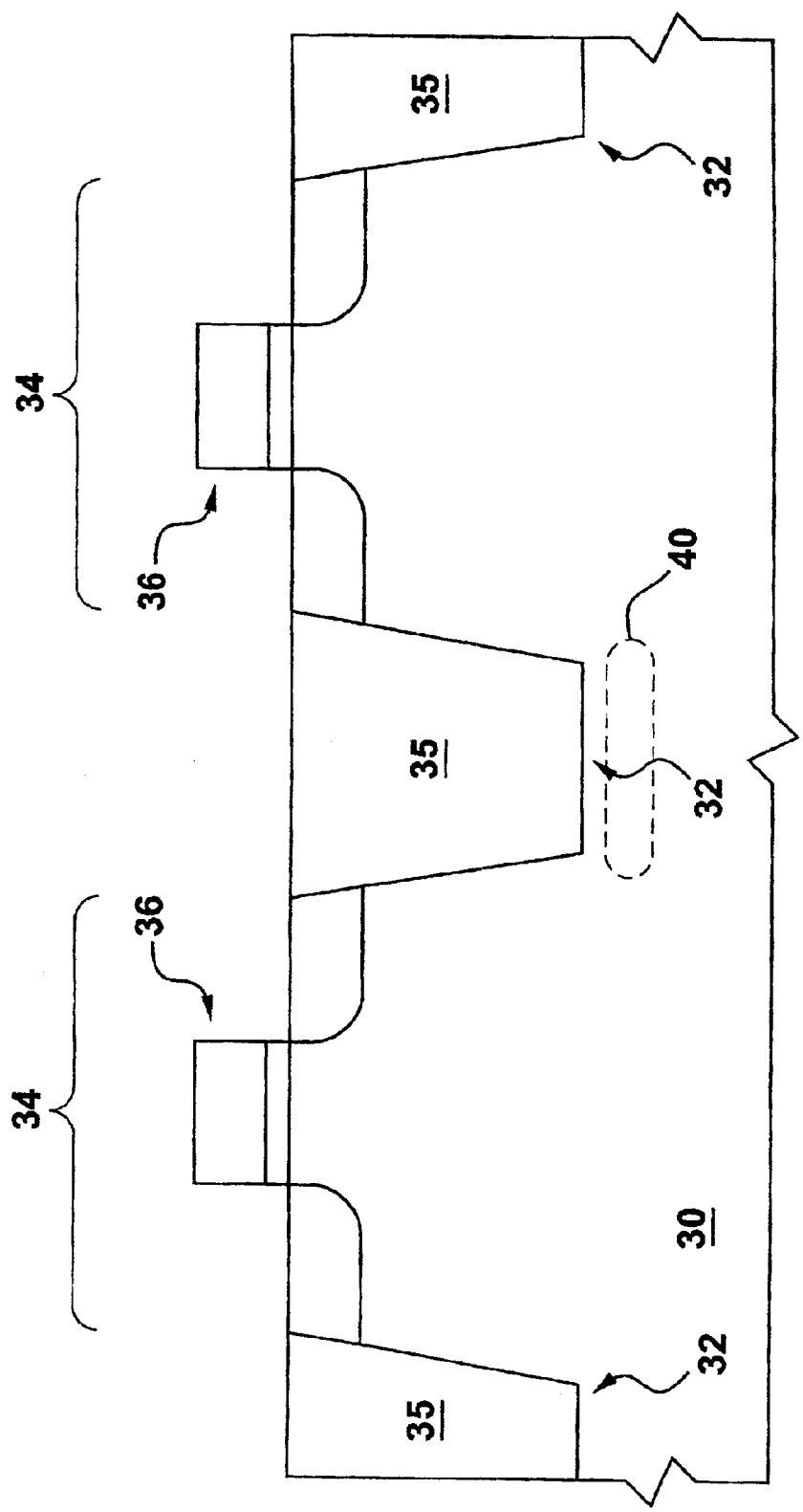
FIG. 2 shows a cross-sectional view of the prior art trench isolation method.
Figure 3:
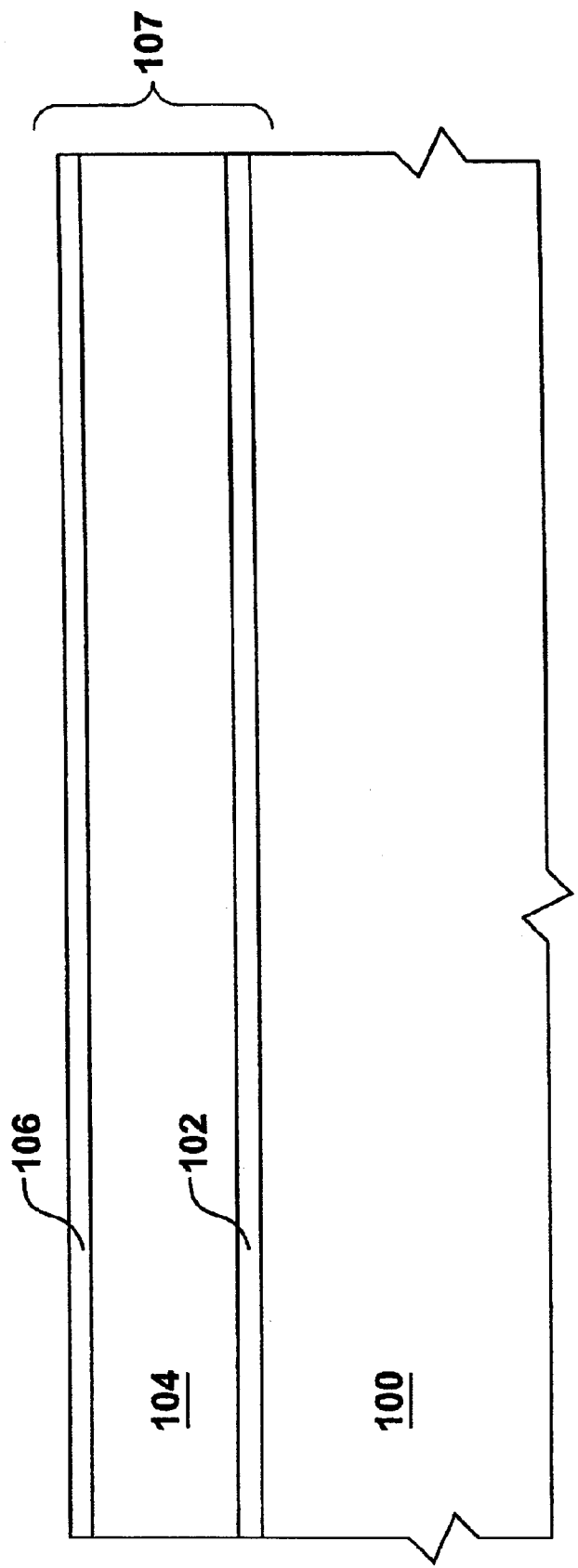
FIGS. 3 through 10 show cross-sectional views showing in sequence the process of the manufacture of an embodiment of the isolation structure of the invention.
Figure 4:
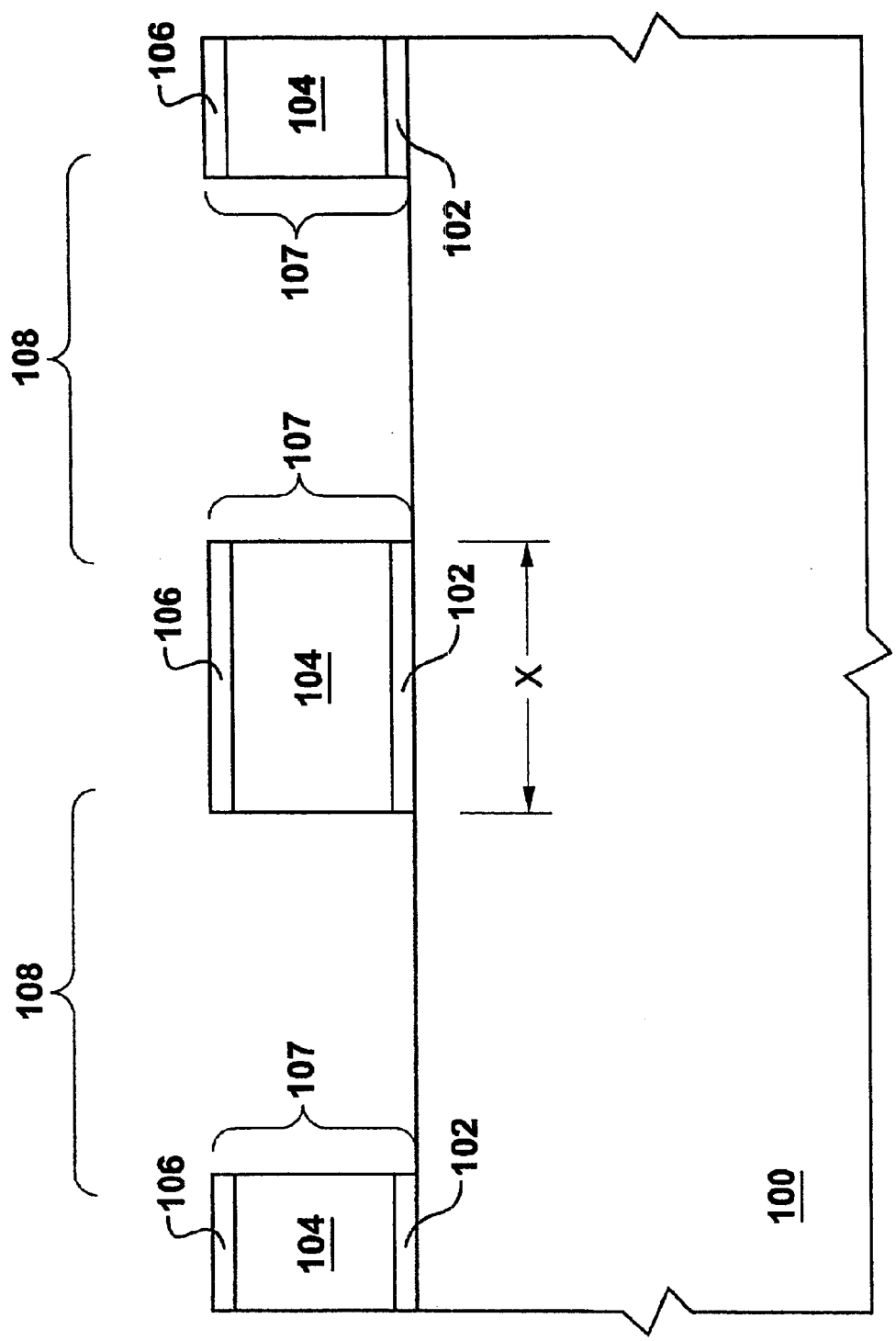

The disclosed isolation structure is illustrated in FIGS. 3–10, which sequentially show using cross-sectional views how the isolation structure is fabricated. Referring to FIG. 3, the process starts in a preferred embodiment using a crystalline silicon substrate 100 which preferably has formed upon it a layer of silicon dioxide 102, a layer of polysilicon 104, and another layer of silicon dioxide 106. This stack 107 is covered with a mask (not shown here), such as a photoresist or spacer hard mask like that described in U.S. Pat. No. 5,939,741, which is incorporated by reference herein. Said mask is patterned and developed to expose the portions of the stack that eventually will coincide with the location of active areas 108 shown in FIG. 4, which correspond to areas where electrical structures will ultimately be formed in the substrate 100. These exposed sections of the stack 107 are then plasma etched to the surface of the substrate, resulting in the structure shown in FIG. 4. In a preferred embodiment, silicon dioxide layer 102 is approximately 50–250 Angstroms thick, and is formed by chemical vapor deposition. The polysilicon is approximately 2500 Angstroms thick, is deposited by traditional means, and is preferably doped using any traditionally known technique to render it suitably conductive. The silicon dioxide layer 106 is preferably 50–400 Angstroms thick, and is formed by chemical vapor deposition. Methods of forming oxides by chemical vapor deposition or, for that matter, other methods, are well known in the art, and many well-known and suitable plasma or other etchants may be used to etch and remove oxide and/or polysilicon from the surface of the substrate. Those skilled in the art would, of course, appreciate that the thicknesses in the foregoing preferred embodiment can vary and are dependent upon the device being built, feature size, operating voltage and the like. Such application specific factors are understood by those skilled in the art and thicknesses other than those in the above preferred embodiment can be determined by traditional engineering methods well known by those skilled in the art.

Figure 5:
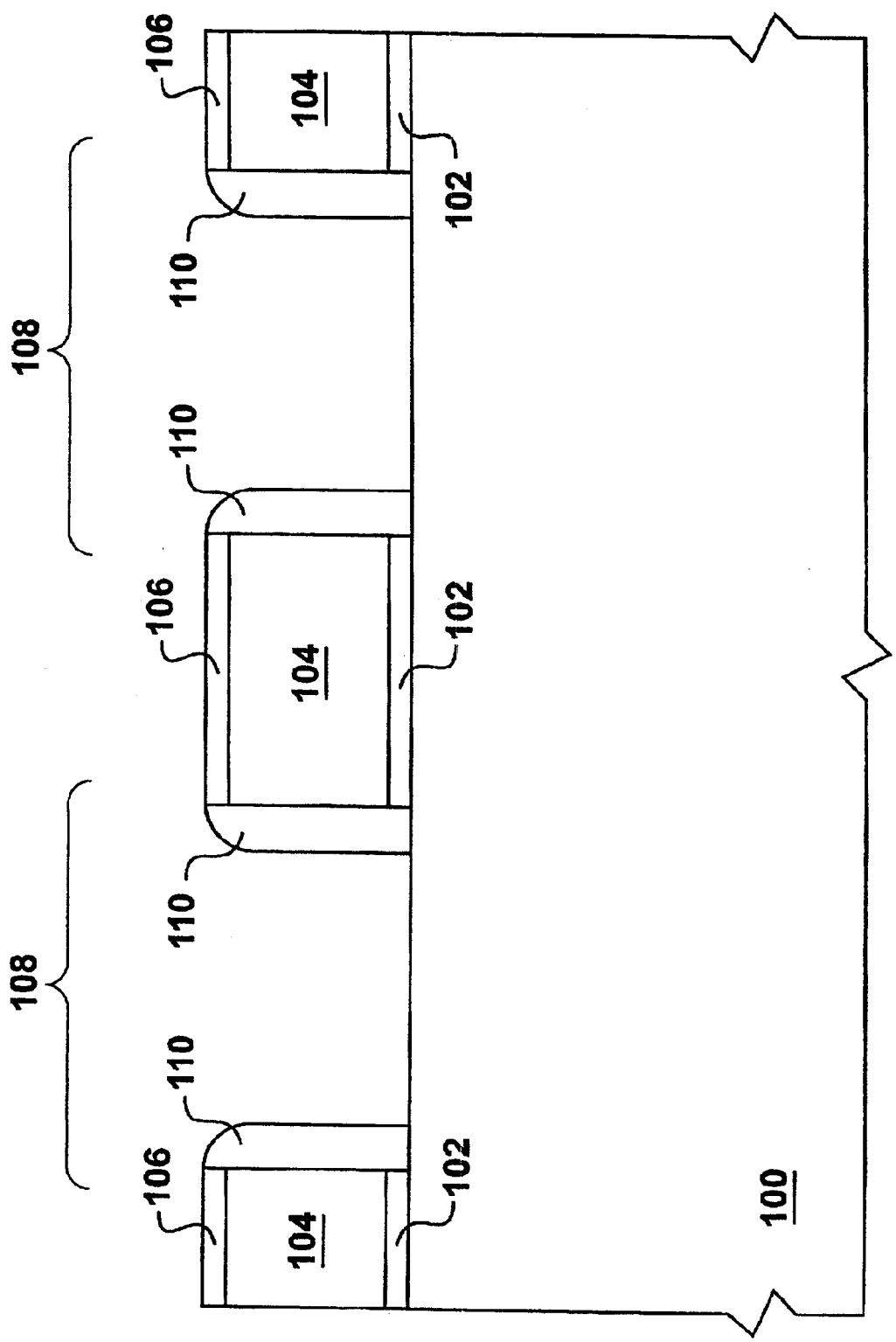

Next, and referring to FIG. 5, silicon dioxide spacers 110 are formed on the sides of the remaining stacks 107. Like most of the processes used in the formation of the disclosed isolation structure, the method for formation of spacers is well known and is only briefly described. In a preferred embodiment, a silicon dioxide is formed conformally, by chemical vapor deposition, over the surface of the structure of FIG. 4 to a thickness of preferably 200 Angstroms. This oxide film is then anisotropically etched to remove in only the vertical direction the 200 Angstroms of oxide, re-exposing the tops of the stacks 107 and the surface of the substrate 100. This leaves a 200 Angstrom thick spacer 110 on the sides of the stacks 107.

Figure 6:
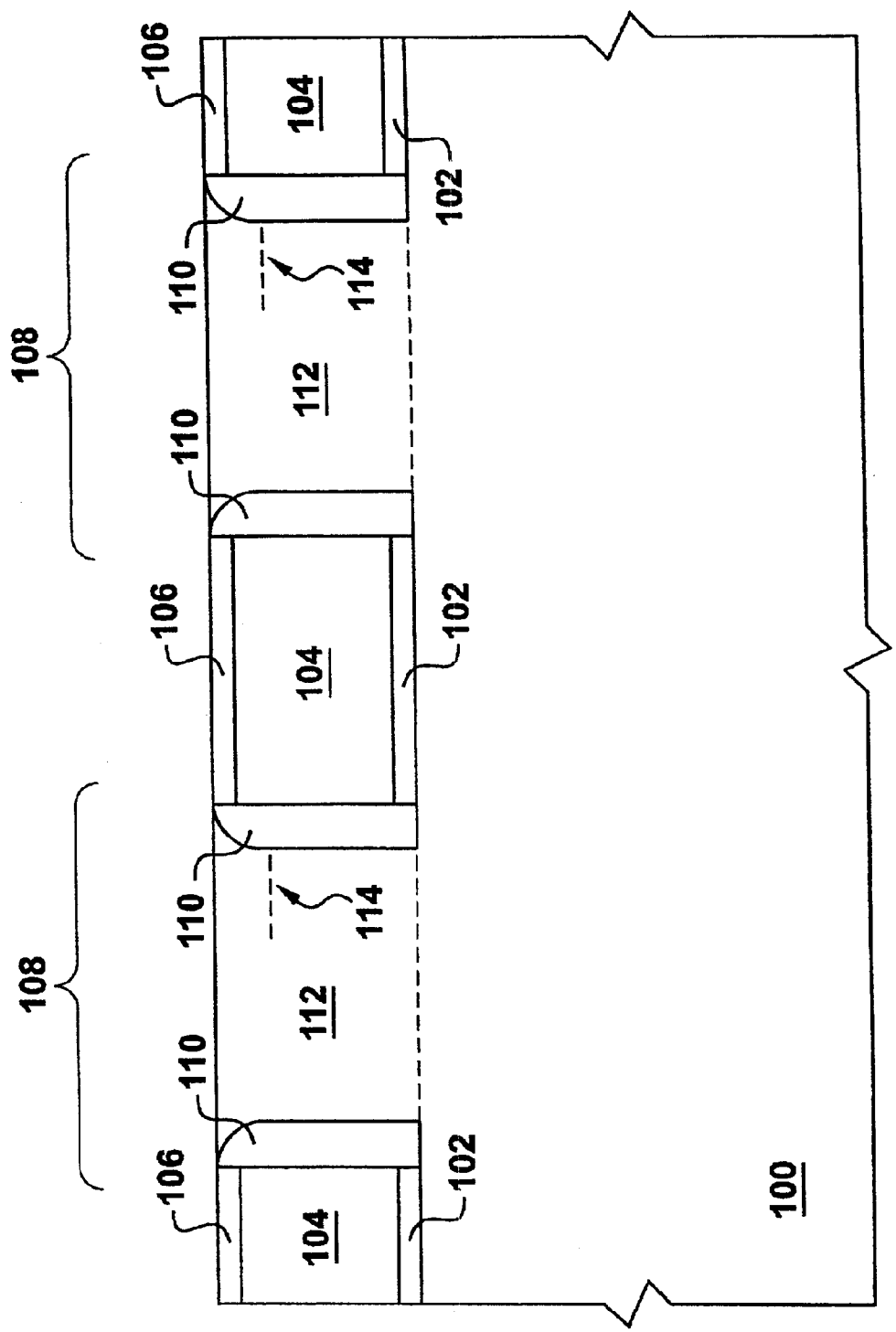

Referring next to FIG. 6, epitaxial silicon 112 is selectively grown on the substrate 100 in the active areas 108 between the stacks 107. As is well known, epitaxially grown silicon 112 involves the introduction of a silicon precursor gas into a deposition chamber. The silicon in the precursor gas is released onto the surface of the silicon substrate 100 and establishes itself as part of the crystalline structure of the substrate 100. In this way, the silicon substrate can in effect be made to grow upwards towards the top of the stack in a crystalline condition suitable for accompanying the electrical structures that will eventually be built in active areas 108.

Many such techniques for the formation of epitaxial silicon are well known, but a preferred process uses either silane or dichlorosilane as the precursor gas. The temperature during epitaxial deposition preferably occurs in the range of 700° C.–900° C., with gas flow rates from 10–100 sccm at a pressures in the range of 10–15 torr, which yields an approximate growth rate of 150 Å per min. As one skilled in the art will recognize, epitaxial growth will only occur on the crystalline substrate, and will not form on the sides of the sidewall oxide 110, or the top of oxide layer 106. However, after epitaxial deposition, chlorine and then hydrogen could be introduced, which combine to form hydrochloric acid to remove residual silicon build-up on non-silicon surfaces. Of course, and as one skilled in the art will recognize, the specific epitaxial growth parameters should be engineered to fit the respective application. For example, time at elevated temperatures should be controlled to stay within the thermal budget of the device being made to prevent excess migration of any dopants present. The process should preferably also proceed slowly enough to render a crystalline silicon film 112 which is sufficiently defect free for the device being made. As a general rule, higher levels of defects can be tolerated in devices amenable to higher levels of leakage or that are built with larger geometries.

Figure 7:
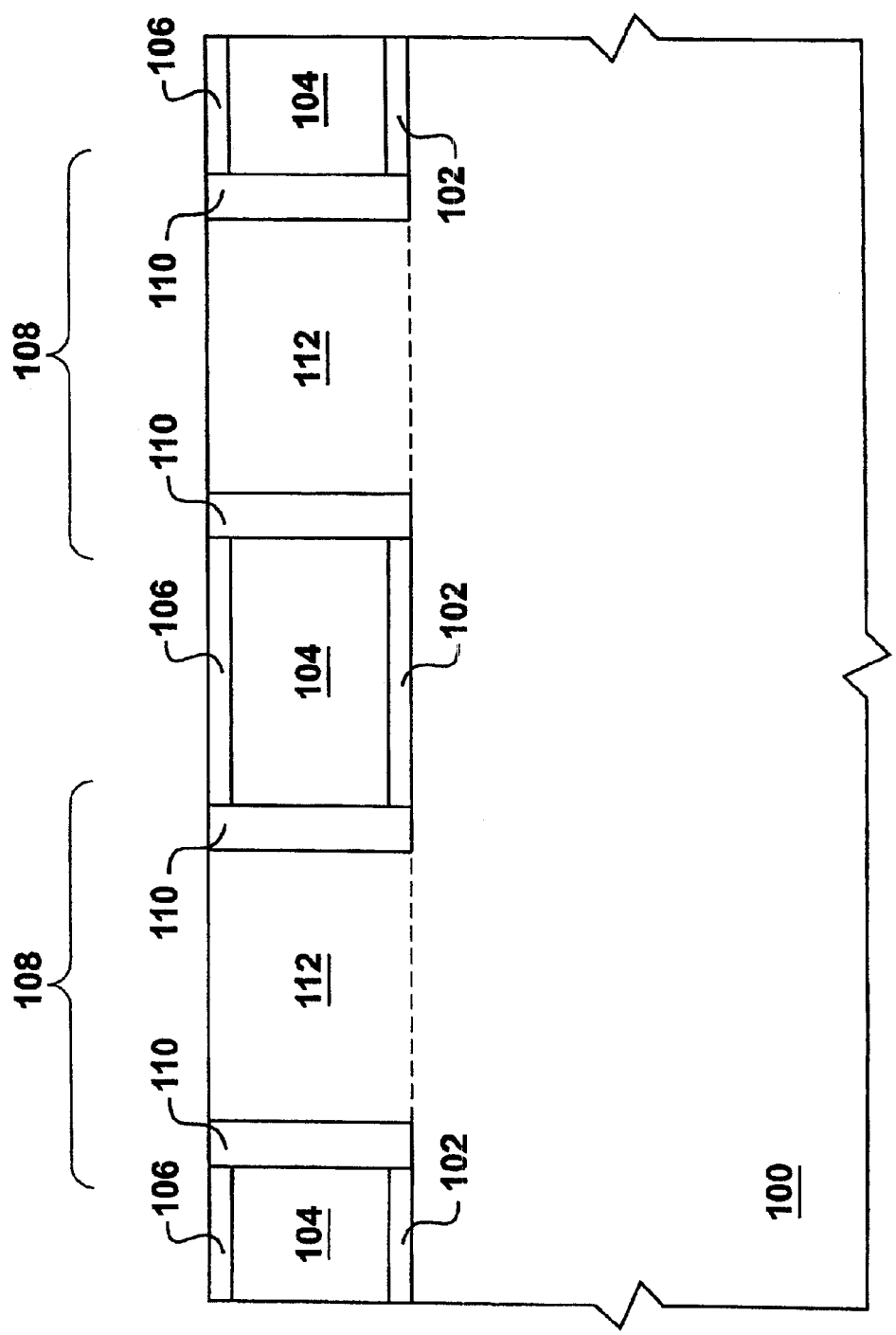

Once grown, selective epitaxial layer 112 defines the active area 108 in which electrical structures such as transistors can be built. After deposition of epitaxial layer 112 to the top of oxide layer 106, it may be possible to immediately form these electrical structures. However, if a suitably planar structure is not achieved, then the resulting structure may at this point be polished using well-known Chemical-Mechanical-Polishing (CMP) techniques to ensure planarity of the structure, resulting in the structure shown in FIG. 7. As shown in FIG. 7, such polishing may result in removal of the rounded portions at the top of the spacers 110. Suitable CMP techniques are known for polishing a substrate in a manner that will not damage the active areas of the silicon substrate. However, such polishing is not strictly necessary to practice the invention. Alternatively, the growth of epitaxial layer 112 could be designed to stop just short of the top of oxide layer 106, e.g., just short of where the corners of the sidewall oxide 110 are reached as shown by dotted line 114 in FIG. 6 so that the epitaxial layer 112 is substantially the same thickness as the isolation structure, but does not proceed all the way to the top of the stack 107. Although resulting in a slightly non-planar structure, this modification would ensure the formation of an epitaxial layer not unduly influenced by the changes in topography nearer to the top of oxide layer 106.

Figure 8:
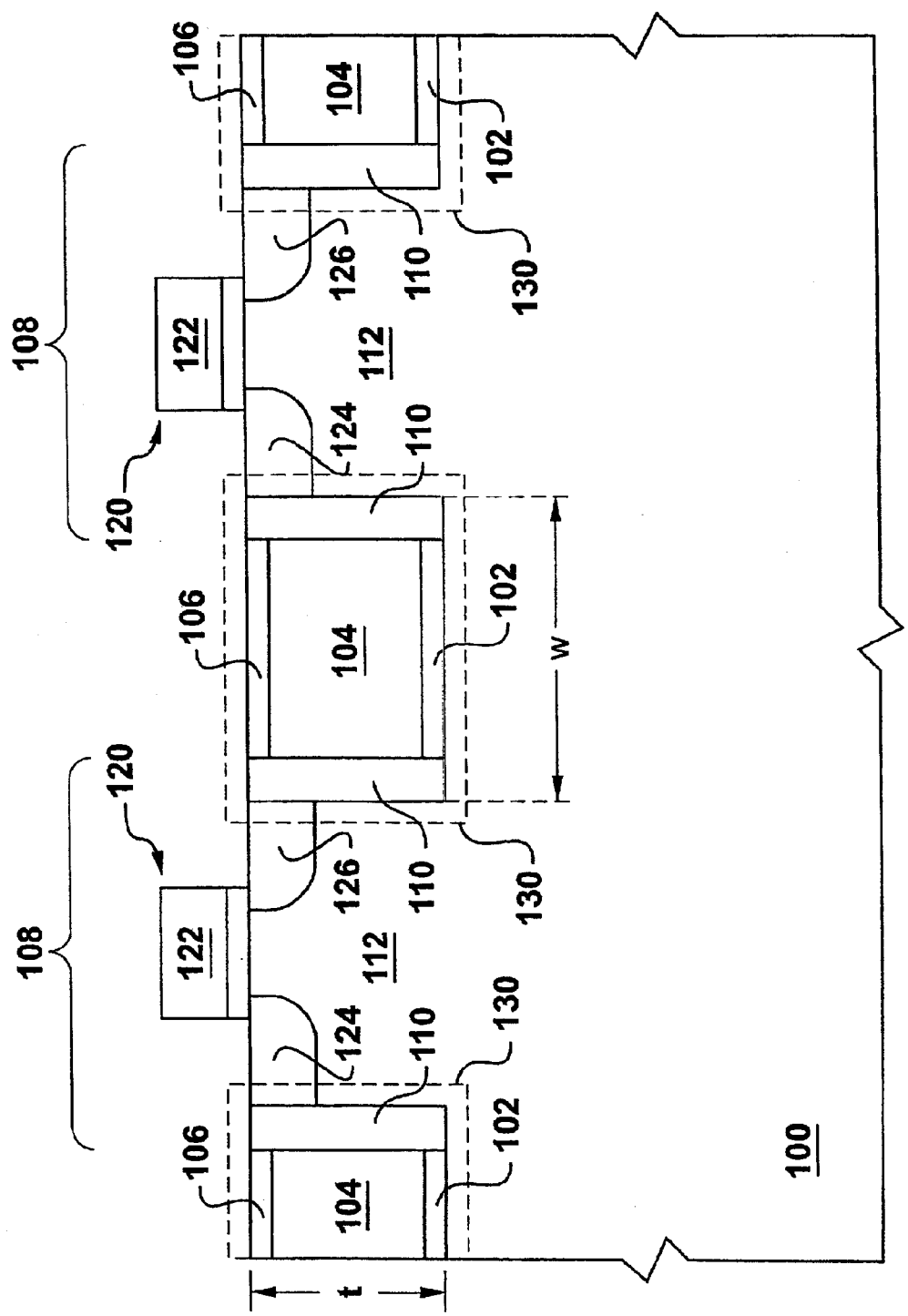

Once the surface of the active areas 108 is prepared, electrical structures may be formed therein. As shown in FIG. 8, transistors 120 (having gates 122, sources 124, and drains 126) have been formed in the active areas 108 using traditional techniques, although other structures such as capacitors, resistors, etc., may be formed in these areas as well depending on the design of the circuit. At this point it can be appreciated that an isolation structure 130 has been fabricated which is capable of preventing, or minimizing, lateral current leakage between the two transistors. This isolation structure prevents lateral leakage by virtue of the dielectric "box" that is created by oxide layers 102, 106, and sidewall oxide 110. This box can easily be made as thick (t) or as wide (w) as desired by adjusting the thickness of layers 102, 104, and 106, the thickness of the sidewall oxide 110, and the linewidth X of the stack 107 (see FIG. 4). It should be noted that although a two-dimensional cross sectional view of the box in shown in the figures, the "box" is actually a 3-dimensional also having a front face and back face (not shown) comprised of the sidewall oxide 110. In other words, in a preferred embodiment, the polysilicon layer 104 is surrounded on all sides by a suitable dielectric.

Figure 9:
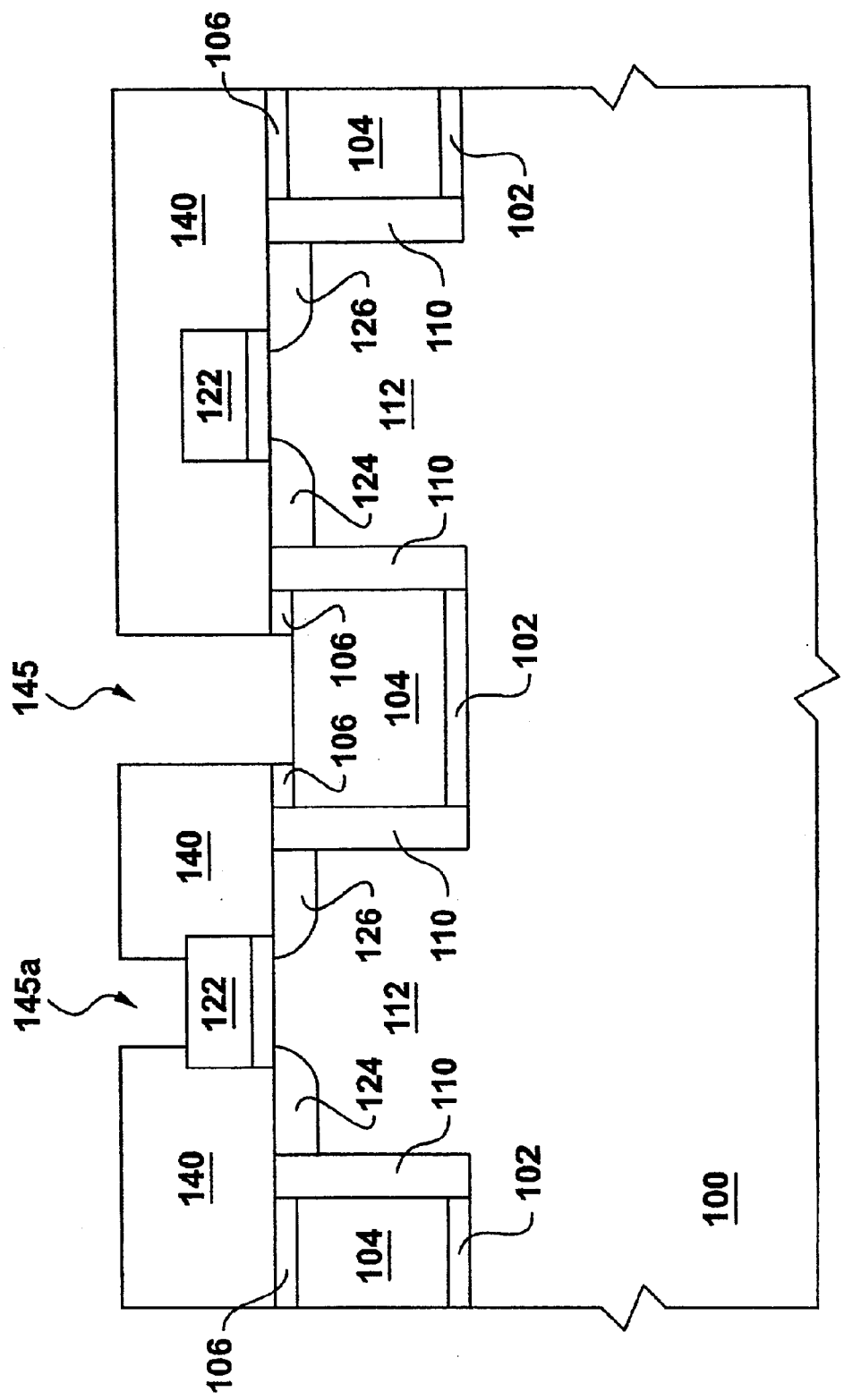

Additional leakage-preventing benefits are provided by the ability to bias the polysilicon layer 104 inside the box with an appropriate voltage, as will be explained after the discussion of processing details. If the processing of the substrate is continued, and referring to FIG. 9, a dielectric 140, preferably an oxide, is deposited on the surface of the resulting structure. Dielectric 140 can be used to isolate the electrical structures (e.g., transistors 120) from conductive interconnects 150 that will eventually be formed over the dielectric (See FIG. 10), and may comprise several sub-steps in its formation, as is well known in the art, although these sub-steps are not shown because not necessary to illustrate aspects of the disclosed invention. Dielectric 140 is then patterned and anisotropically plasma etched to form vias 145 which provide contact points to the underlying circuitry, such as to the gates, sources, and drains of the transistors 120. (One exemplary gate via 145a is shown in FIG. 9). During the etching of the vias, vias may also be etched to reach the polysilicon layer 104 as shown. Although other vias so etched do not meet oxide layer 106 at their bottom, a plasma etch which is suitably selective to oxides will ensure that the via etch will stop on all requisite silicon based structures (such as layer 104, gates 122, and sources and drains 124 and 126) without sufficient risk of over-etching. Suitably selective etchants are well known in the art, and include $CF_4$, $CHF_3$, $C_4F_6$, $C_4F_8$.

Figure 10:
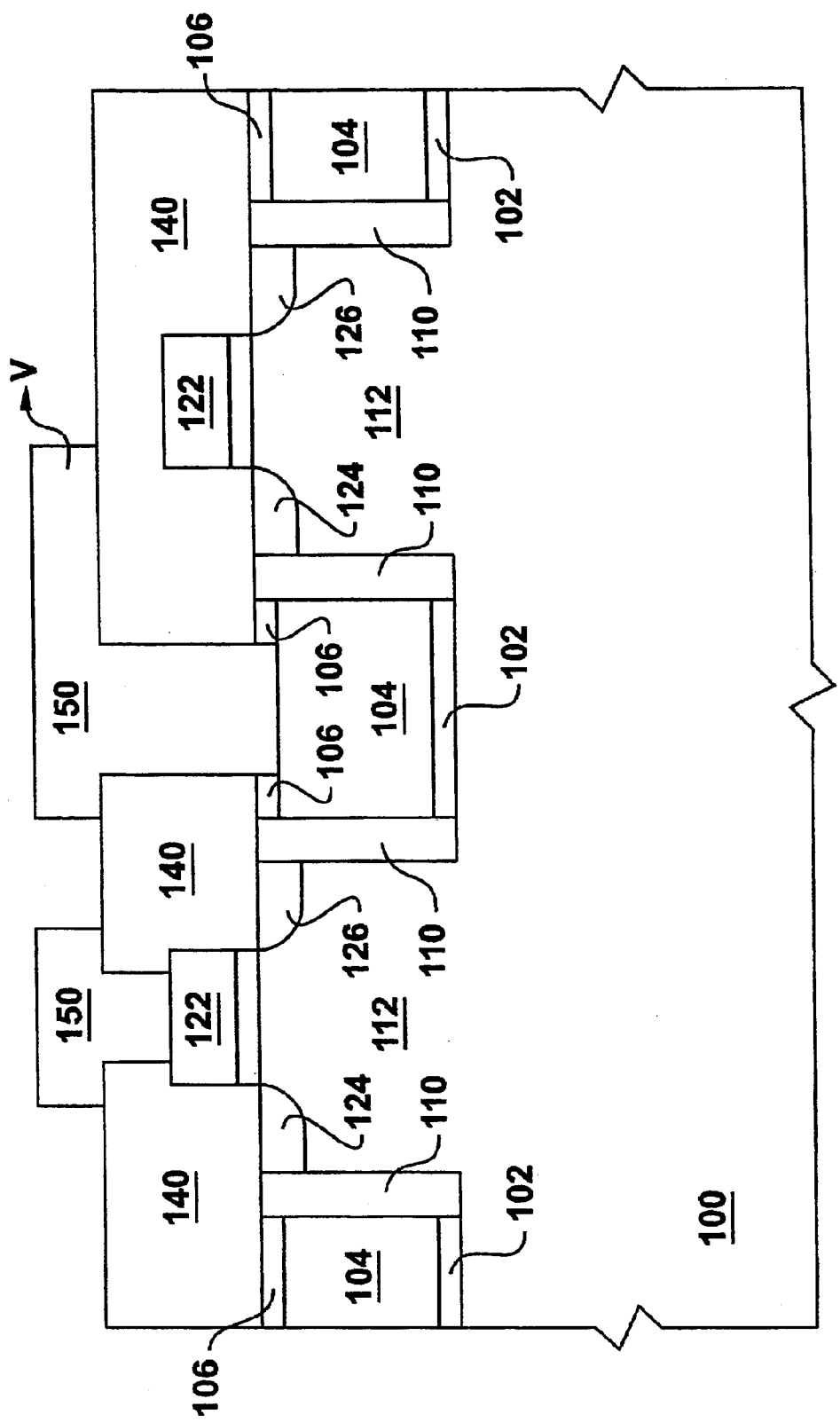

Thereafter, and referring to FIG. 10, a conductive interconnect layer 150 is deposited and etched to form a layer of conductive interconnects which, through the vias, interconnects the electrical structures as needed according to the function of the circuit. Again, deposition and etching of the interconnect layer 150 may comprise several sub-steps in its formation, as is well known in the art, although these sub-steps are not shown because they are not necessary to illustrate aspects of the disclosed invention. For example, as a separate step, conductive plugs could be formed in the vias before deposition and patterning of the interconnect layer. Hereinafter, the processing of the integrated circuit would continue to completion using known techniques.

With the structure so formed, a bias voltage V may be placed on the polysilicon layer 104, which in certain applications can improve isolation and reduce leakage between the active devices. For example, assume that transistors 120 are N-channel transistors used in a Complementary-Metal-Oxide-Semiconductor (CMOS) process. In such case, the transistors would normally be back-biased by contacts made to the substrate 100 (not shown) to ground (i.e. 0 Volts). Accordingly, to keep layer 104 in parity with the substrate voltage, and to ensure that it is not unduly affected by voltages appearing in overlying conductive interconnects, layer 104 could also be biased to ground. For P-channel devices, which are normally built in a back-biased n-well to a higher logic '1' level state (e.g., 5V, 3.3V, 2.5V, etc.), layer 104 could be biased to the same logic '1' level. However, biasing layer 104 inside of the dielectric box may not be necessary for all applications, as the dielectric box itself could provide adequate isolation even absent biasing. However, biasing layer 104 is presently preferred, especially given the fact that otherwise this layer might be made to "float" by voltage coupling to an undesirable voltage level in certain applications, possibly negatively affecting circuit performance.

One skilled in the integrated circuit arts will realize that the disclosed isolation structure, and the method of its manufacture, is subject to many modifications. For example, while the disclosed dielectric layers 102, 106, and 110 are preferably formed of silicon dioxide, other suitable dielectrics or combinations of dielectrics could be used, such as silicon nitrides or silicon oxynitrides or other known or yet to be discovered dielectrics. Likewise, layer 104, while preferably made of doped polysilicon, could be made of other suitable conductive or semiconductive materials or combinations thereof; such as copper, titanium, tungsten, aluminum, platinum, various conductive metallic nitrides or silicides, or other materials. However, as one skilled in the art will recognize, care in choosing the material for layer 104 should be made to ensure that the material is consistent with the remaining processing steps that will be employed to finish the integrated circuit, e.g., that the material will not melt when exposed to subsequent processing temperatures or undesirably diffuse into surrounding material, such as copper without a barrier layer.

Additionally, it should be recognized that not all of the dielectric layers 102, 106, and 110 may be needed to form an adequate isolation structure. Thus, layer 102 could be removed from the process leaving only sidewall oxide 110 and layer 106 to perform the isolation function. If layer 102 were missing, it would possibly not be necessary to make a contact to layer 104, as that layer would already be in contact with the substrate and appropriately biased.

Additionally, the disclosed technique, while preferably used in conjunction with crystalline silicon substrates, could also be readily modified to work with other types of crystalline substrates 100 materials, such as germanium, gallium arsenide, indium phosphide, etc., or doped versions thereof, which are useful in making integrated circuits. One skilled in the art will realize that use of the disclosed technique would require a suitable epitaxial process to build upon the substrate 100, many of which are well known for various different materials. Such processes are well known, and/or could be readily developed with routine experimentation by those skilled in the art. Additionally, it may be possible to epitaxially deposit materials different from those used for the crystalline substrate 100. Of course, this may require employing lattice matching techniques or other modification to ensure suitable epitaxial growth.

As used in the claims, stating that a layer is formed "on" an underlying structure or layer should not be interpreted to mean that such layer is necessarily in contact with the underlying structure or layer, but instead should be interpreted as including the possibility that an intervening layer or layers appears between the two. Moreover, "conductive" should be interpreted to mean materials that are conductive as well as semiconductive.

It is contemplated that various substitutions, alterations, and/or modifications, including but not limited to those design alternatives which might have been specifically noted in this disclosure, may be made to the disclosed embodiment without departing from the spirit and scope of the invention as defined in the appended claims.

What is claimed is:

1. A method of forming an isolation region between two active regions of a substrate formed of a crystalline material, comprising:

forming a conductive layer on the crystalline substrate;

forming a first dielectric layer on the conductive layer;

forming at least two recesses through the conductive layer and first dielectric layer to expose the crystalline substrate at the active regions, the at least two recesses having sides defined at least in part by the conductive layer and first dielectric layer;

forming a second dielectric on the sides of at least the conductive layer; and forming crystalline material in the recesses at the active regions; and forming electrical structures in or on the crystalline material at the active regions.

2. The method of claim 1, wherein the conductive layer comprises polysilicon.

3. The method of claim 1, wherein the crystalline material comprises silicon.

4. The method of claim 1, wherein the first or second dielectric is selected from the group consisting of a silicon dioxide, a silicon nitride, and a silicon oxynitride.

5. The method of claim 1, wherein forming the second dielectric on the sides of the conductive layer comprises forming a sidewall dielectric.

6. The method of claim 1, further comprising forming a contact to the conductive layer to provide a bias to the conductive layer.

7. The method of claim 1, wherein forming crystalline material comprises the use of an epitaxial process.

8. The method of claim 1, further comprising forming a third dielectric layer between the conductive layer and the crystalline substrate.

9. The method of claim 8, wherein the conductive layer comprises polysilicon.

10. The method of claim 8, wherein the crystalline material comprises silicon.

11. The method of claim 8, wherein the first, second or third dielectric is selected from the group consisting of a silicon dioxide, a silicon nitride, and a silicon oxynitride.

12. The method of claim 8, wherein forming the second dielectric on the sides of the conductive layer comprises forming a sidewall dielectric.

13. The method of claim 8, further comprising forming a contact to the conductive layer to provide a bias to the conductive layer.

14. The method of claim 8, wherein forming crystalline material comprises the use of an epitaxial process.

15. A method of forming an isolation region between two active regions of a substrate fanned of a crystalline material, comprising:

forming an isolation structure on the crystalline substrate between the active regions, the isolation structure comprising a conductive layer having sides, the isolation structure further comprising a first dielectric layer formed on top of the conductive layer and a second dielectric layer on the sides of the conductive layer, forming crystalline material on the crystalline substrate at the two active regions, wherein the second dielectric is at least partially between the crystalline material formed at the two active regions and the conductive layer; and forming electrical structures in or on the crystalline material at the active regions.

16. The method of claim 15, wherein the conductive layer comprises polysilicon.

17. The method of claim 15, wherein the crystalline material comprises silicon.

18. The method of claim 15, wherein the first or second dielectric is selected from the group consisting of a silicon dioxide, a silicon nitride, and a silicon oxynitride.

19. The method of claim 15, wherein forming the second dielectric on the sides of the conductive layer comprises forming a sidewall dielectric.

20. The method of claim 15, further comprising forming a contact to the conductive layer to provide a bias to the conductive layer.

21. The method of claim 15, wherein forming crystalline material comprises the use of an epitaxial process.

22. The method of claim 15, wherein the isolation structure further comprises a third dielectric layer formed between the crystalline substrate and the conductive layer.

23. The method of claim 22, wherein the conductive layer comprises polysilicon.

24. The method of claim 22, wherein the crystalline material comprises silicon.

25. The method of claim 22, wherein the first, second or third dielectric is selected from the group consisting of a silicon dioxide, a silicon nitride, and a silicon oxynitride.

26. The method of claim 22, wherein forming the second dielectric on the sides of the conductive layer comprises forming a sidewall dielectric.

27. The method of claim 22, further comprising forming a contact to the conductive layer to provide a bias to the conductive layer.

28. The method of claim 22, wherein forming crystalline material comprises the use of an epitaxial process.

29. A method of forming an isolation region between two active regions of a substrate formed of a crystalline material, comprising:

forming a conductive layer between the active regions, wherein the conductive layer has sides, a top, and a bottom, wherein the sides, bottom, and at least a portion of the top are in contact with at least one dielectric material;

forming crystalline material on the crystalline substrate at the two active regions to a level proximate to the top of the conductive material, and forming electrical structures in or on the crystalline material at the active regions.

30. The method of claim 29, wherein the conductive layer comprises polysilicon.

31. The method of claim 29, wherein the crystalline material comprises silicon.

32. The method of claim 29, wherein the dielectric material is selected from the group consisting of silicon dioxide, silicon nitride, and silicon oxynitride.

33. The method of claim 29, further comprising forming a contact to the conductive layer to provide a bias to the conductive layer.

34. The method of claim 29, wherein forming crystalline material comprises the use of an epitaxial process.

35. The method of claim 29, wherein the electrical structures are selected from the group consisting of transistors, capacitors, and resistors.

* * * * *